United States Patent [19]

Takehara

[11] Patent Number: 4,480,231
[45] Date of Patent: Oct. 30, 1984

[54] CIRCUIT FOR REDUCING OFFSET VOLTAGE DRIFT IN DIFFERENTIAL AMPLIFIERS

[75] Inventor: Shigeru Takehara, Tokyo, Japan
[73] Assignee: Motorola, Inc., Schaumburg, Ill.
[21] Appl. No.: 411,192
[22] Filed: Aug. 25, 1982
[51] Int. Cl.³ .............................................. H03F 1/26
[52] U.S. Cl. ..................................... 330/261; 330/149
[58] Field of Search ................ 330/253, 257, 261, 149
[56] References Cited
FOREIGN PATENT DOCUMENTS
0886202 11/1981 U.S.S.R. .............................. 330/253

Primary Examiner—James B. Mullins
Assistant Examiner—G. Wan
Attorney, Agent, or Firm—Anthony J. Sarli, Jr.; Jeffrey Van Myers; Robert L. King

[57] ABSTRACT

A differential pair of transistors is coupled to a current source and an active load to provide an output voltage which has little offset voltage drift with respect to input voltage variation. Biasing means establish a predetermined current which is supplied to the differential pair and which is varied by control means in response to the input signal to reduce offset voltage drift.

11 Claims, 1 Drawing Figure

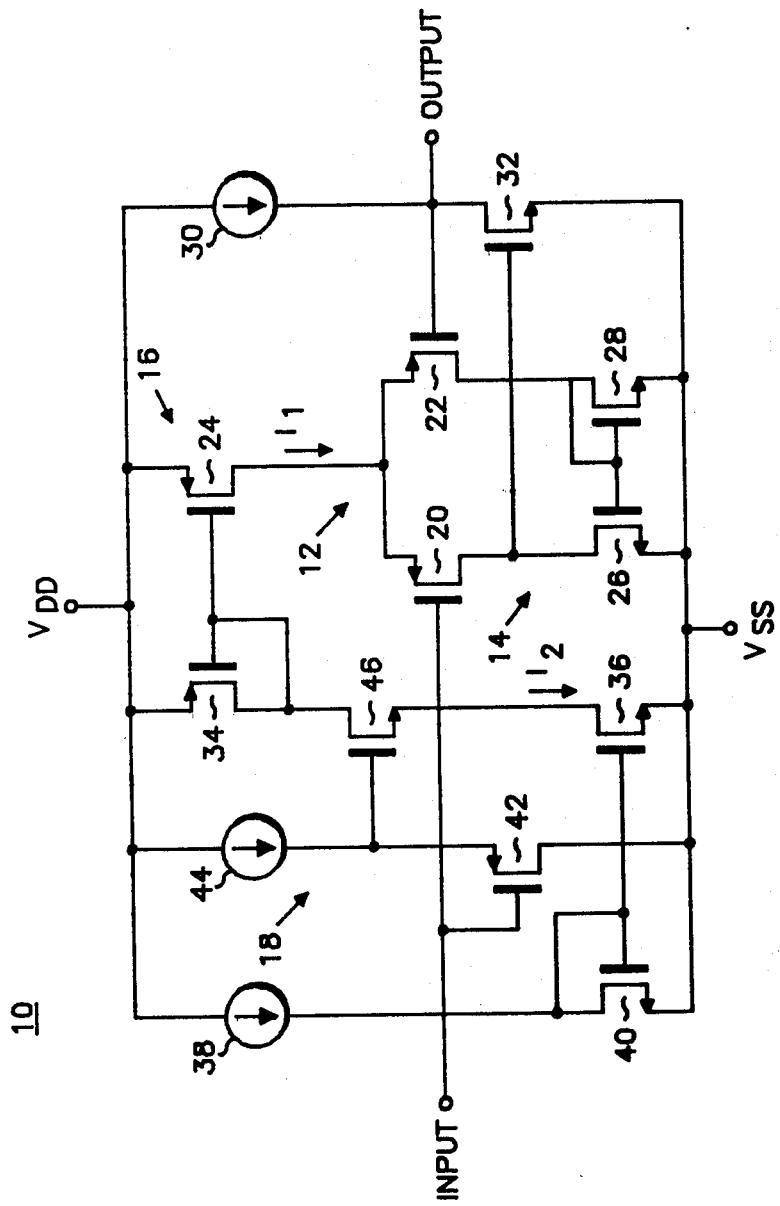

CIRCUIT FOR REDUCING OFFSET VOLTAGE DRIFT IN DIFFERENTIAL AMPLIFIERS

TECHNICAL FIELD

This invention relates generally to differential amplifier circuits, and, more particularly, to differential amplifiers which reduce offset voltage drift.

BACKGROUND ART

In general, every operational amplifier having an input differential pair of transistors has an offset voltage associated therewith due in part to an uncontrollable mismatch of the transistors. When different voltage potentials are applied to the input electrodes of the differential pair of transistors, the associated offset voltage drifts as a function of the magnitude of the differential input voltage. When an operational amplifier is coupled in a unity gain configuration, offset voltage drift may be substantial because offset drift increases exponentially as a function of the differential input. Others have used clamping diodes across the control electrodes of the differential pair of transistors to limit the potential difference. However, the use of clamping diodes couples one input signal source to the other via a low impedance path and defeats the advantage of high input impedance of MOS differential amplifiers. Others have clamped the control electrodes of the differential pair of transistors by using additional transistors without substantially loading the external circuitry as taught in U.S. Pat. No. 4,206,418 by Dingwall. Such circuits however slow the response time of the differential amplifier by using both gating and clamping transistors to limit the input differential voltage.

BRIEF SUMMARY OF THE INVENTION

It is an object of the present invention to provide an improved circuit for reducing offset voltage drift in a differential amplifier.

Another object of the present invention is to provide a differential amplifier which minimizes offset voltage drift caused by varying differential input signals and which also has a fast response time.

A further object of the present invention is to provide a unity gain MOS differential amplifier having reduced offset voltage drift.

In carrying out the above and other objects of the present invention, there is provided, in one form, a differential pair of transistors which is coupled to an input and an output terminal. Current source means which are coupled to a first supply voltage and to the differential pair provide a predetermined current to the differential pair. Active load means coupled to the differential pair develop an output voltage. Control means are coupled to both the current source and the input terminal for varying the predetermined current which is provided to the differential pair in response to the variation of the input signal in order to substantially reduce offset voltage drift.

The above and other objects, features and advantages of the present invention will be more clearly understood from the following detailed description taken in conjunction with the accompanying drawing.

BRIEF DESCRIPTION OF THE DRAWING

The FIGURE illustrates in schematic form a circuit for reducing offset voltage drift.

DESCRIPTION OF THE PREFERRED EMBODIMENT

Shown in the FIGURE is a circuit 10 which substantially reduces offset voltage drift in a differential amplifier. Circuit 10 generally comprises a differential pair of transistors 12, active load means 14, current source means 16, and control means 18. While specific N-channel and P-channel devices are shown and described throughout the detailed description, it should be clear that this invention could be implemented by completely reversing the processing techniques (e.g. P-channel to N-channel) or by using other types of transistors.

A P-channel transistor 20 and a P-channel transistor 22 are coupled together to form differential pair 12. A P-channel transistor 24 comprises current source means 16 and N-channel transistors 26 and 28 comprise active load means 14. A source electrode of transistor 24 is coupled to a first supply voltage VDD, and a drain electrode of transistor 24 is coupled to source electrodes of transistors 20 and 22. A gate electrode of transistor 20 is coupled to an input terminal which is coupled to an input signal, and a gate electrode of transistor 22 is coupled to an output terminal. Source electrodes of transistors 26 and 28 are coupled to a second supply or voltage, illustrated as $V_{SS}$. The drain electrode of transistor 28 is also connected to its gate electrode and connected to both a gate electrode of transistor 26 and a drain electrode of transistor 22. A current source 30 and an N-channel transistor 32 form an output stage. A first terminal of current source 30 is coupled to first supply voltage $V_{DD}$ and a second terminal of current source 30 is coupled to the output terminal, to the gate electrode of transistor 22 and to a drain electrode of transistor 32. A gate electrode of transistor 32 is coupled to both drain electrodes of transistors 20 and 26, and a source electrode of transistor 32 is coupled to second supply voltage $V_{SS}$.

Differential pair 12 is biased, in part, by a P-channel transistor 34 and an N-channel transistor 36. Transistor 36 is biased by a current source 38 and an N-channel transistor 40. Control means 18 comprise a P-channel transistor 42 which is sourced by a current source 44, and control means 18 also comprise a level-shifting N-channel transistor 46. A source electrode of transistor 34 is coupled to first supply voltage $V_{DD}$ and transistor 34 has a gate electrode connected to its drain electrode. The gate electrodes of transistors 24 and 34 are coupled together. Transistor 46 has a drain electrode connected to the drain electrode of transistor 34, and a source electrode of transistor 46 is connected to a drain electrode of transistor 36. A source electrode of transistor 36 is coupled to second supply voltage $V_{SS}$. A first terminal of current source 38 is coupled to first supply voltage $V_{DD}$, and a second terminal of current source 38 is coupled to a drain electrode of transistor 40. Transistor 40 has its drain and gate electrodes connected together. A source electrode of transistor 40 is coupled to second supply voltage $V_{SS}$, and the gate electrodes of transistors 36 and 40 are coupled together. A first terminal of current source 44 is coupled to supply voltage $V_{DD}$, and a second terminal of current source 44 is coupled to both a gate electrode of transistor 46 and a source electrode of transistor 42. Transistor 42 has a drain electrode coupled to second supply voltage $V_{SS}$ and a gate electrode coupled to the input terminal.

In operation, current source 24 provides a predetermined current, $I_1$, to differential pair 12. In a conventional operational amplifier stage having a differential pair of transistors, a current source and an active load, an offset voltage is present when no input voltage is applied due, in part, to the inability to make two differential transistors with exactly the same electrical and physical characteristics. Another problem associated with offset voltage is input offset voltage drift which is variation of the offset voltage in proportion to the variation of input voltage. In a differential pair of transistors, such as transistors 20 and 22, the gate-source electrode conductance of transistors 20 and 22 increases as the input voltage increases. The P-channel transistors 20 and 22 have the substrate thereof conventionally connected to a fixed positive voltage other than the positive potential voltage of the source electrode. Hence, a substantial reverse bias exists between the source and the substrate which increases the threshold voltage. For N-channel differential inputs, when the substrates thereof are connected to a ground level or other fixed potential which is different from the potential of the source electrodes, an analogous reverse bias voltage exists. If the source and substrate are connected together to the same voltage potential, no reverse bias voltage exists. However, this configuration does not have wide application and a reverse bias voltage is often present. As the input voltage which is applied to the gate electrode of transistor 20 increases, the source-substrate reverse bias voltage decreases. A small source-substrate reverse bias voltage creates a larger gate-source conductance. As a consequence of the variation of gate-source conductance of transistors 20 and 22, the offset voltage associated therewith will also vary. As the input voltage approaches a ground or zero voltage potential, the offset voltage drift increases because transistors 20 and 22 are operated in a non-saturation portion of a conventional characteristic curve. As the input voltage approaches the $V_{DD}$ potential, the offset voltage drift is also significant because transistor 24 is operated in a non-saturated region of its characteristic curve which reduces current $I_1$. As the input signal increases, the gate-source voltage of transistor 20 will decrease. Simultaneously, the drain-source voltage across transistor 24 is reduced. Due to the fact that transistor 24 has a finite output impedance, current $I_1$ decreases. The gate-source voltage of transistor 22 attempts to match the gate-source voltage of transistor 20. However, since the conductance of transistors 20 and 22 varies, unequal and varying currents flow through transistors 20 and 22.

To compensate for the undesirable offset voltage drift, the inventive circuit of FIG. 1 reduces offset voltage drift by increasing $I_1$ as a function of input voltage. Transistors 34 and 36 are bias means for establishing current $I_1$ through transistor 24. Transistor 36 is a current source which provides a current $I_2$ which is mirrored via transistor 34 through transistor 24. Transistor 34 functions as a mirror means. Transistors 42 and 46 control current $I_1$ as a function of the input voltage. Transistor 42 is a source follower and current source 44 provides a source current to transistor 42. The voltage between the source of transistor 42 and $V_{SS}$ varies directly with the input voltage. Transistor 46 is used as a level shifter and controls the voltage level between the drain of transistor 36 and $V_{SS}$. Thus, the voltage variation of the drain to source voltage of transistor 36 is proportional to the the input voltage. Because transistor 36 has a finite output impedance which can be made to vary over process and temperature in a similar manner to the output impedance of transistor 24, current $I_2$ is made to vary with respect to input voltage and is mirrored via transistor 34 into transistor 24 to similarly vary current $I_1$. In the inventive circuit, as the input signal or gate voltage of transistor 20 increases, transistor 24 begins to turn off, and more current is sourced through transistor 24 since $I_2$ increased. Therefore, the current through current source transistor 24 has been compensated in response to the input signal variation to make the current density through transistors 20 and 22 much less dependent on input voltage variation. The net effect of circuit 10 is to substantially reduce the offset voltage drift. Current source 38 and transistor 40 function as bias means to establish current $I_2$ through transistor 36.

Since current source transistor 24 is not an ideal current source because of a varying finite output impedance, current $I_1$ has been compensated to remain constant with respect to input voltage variation. It should be noted that circuit 10 has been illustrated in a unity gain differential amplifier configuration where an output has been coupled to one of the two inputs. The invention may be applied however to all types of differential amplifier configurations. By now it should be appreciated that a circuit which substantially reduces offset voltage drift and which still has a fast response time has been provided.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of this invention.

I claim:

1. A circuit for reducing offset voltage drift in a differential amplifier having an offset voltage comprising:
   a differential pair of transistors coupled to an input terminal adapted to receive an input signal and coupled to an output terminal;
   current source means coupled to a first supply voltage terminal and to said differential pair, for providing a predetermined current to said differential pair;
   active load means coupled to a second supply terminal and to said differential pair, for developing an output voltage; and
   control means coupled to said current source means and to said input terminal, for varying said predetermined current in response to variation of said input signal to maintain a substantially constant offset voltage.

2. The circuit of claim 1 further comprising:
   biasing means coupled to said current source means; and
   an output stage coupled to said differential pair of transistors and to said active load means, for providing said output voltage.

3. The circuit of claim 2 wherein said biasing means comprise:
   a first transistor having a source electrode coupled to said first supply voltage terminal, and a gate electrode connected to a drain electrode and coupled to said current source means; and
   second current source means coupled to said first transistor and to said second supply voltage terminal, for providing a biasing means current wherein said predetermined current is proportional to said biasing means current.

4. The circuit of claim 3 wherein said control means comprise:
   source follower means coupled to both said input signal and said second supply voltage terminal, for varying both said biasing means current and said predetermined current in response to said input signal;
   third current source means coupled to said first supply voltage terminal and to said source follower means, for providing a source follower current; and
   level shift means coupled to said source follower means, to said second current source means, to said first transistor and to said second current source means, for controlling the level of voltage across said second current source means.

5. The circuit of claim 4 wherein said control means further comprise:
   second biasing means coupled to said second current source means for establishing said biasing means current.

6. The circuit of claim 4 wherein said source follower means comprise:
   a second transistor of a first conductivity type having a source electrode coupled to said third current source means and to said level shift means, a gate electrode coupled to said input signal, and a drain electrode coupled to said second supply voltage terminal.

7. The circuit of claim 6 wherein said level shift means comprise:
   a third transistor of a second conductivity type having a drain electrode coupled to both the drain and the gate electrodes of said first transistor and to said first current source means, a gate electrode coupled to both said third current source means and to the source electrode of said second transistor, and a source electrode coupled to said second current source means.

8. The circuit of claim 7 wherein said second current source means comprise:
   a fourth transistor of said second conductivity type having a drain electrode coupled to the source electrode of said third transistor, a gate electrode coupled to said second biasing means, and a source electrode coupled to said second supply voltage terminal.

9. The circuit of claim 5 wherein said second biasing means comprise:
   fourth current source means coupled to said first supply voltage terminal; and
   a bias transistor of said second conductivity type having both a drain and a gate electrode connected together and coupled to both said fourth current source means and to the gate electrode of said fourth transistor, and a source electrode coupled to said second supply voltage terminal.

10. A method of compensating for offset voltage drift in an operational amplifier connected in a unity gain configuration, comprising the steps of:
    providing a current to a differential pair of input transistors having an input thereof coupled to an input signal, said differential pair of transistors having an offset voltage associated therewith; and
    varying said current in proportion to said input signal to maintain the offset voltage substantially constant.

11. A method of reducing offset voltage drift in a differential amplifier wherein the differential amplifier has a least an input, a differential pair of transistors and a current source, comprising the steps of:
    receiving an input voltage;
    providing a first current proportional to the input voltage; and
    mirroring the first current so that the current source provides to the differential pair of transistors a second current proportional to the first current, said second current varying in response to variation of the input voltage to maintain a substantially constant offset voltage between the pair of transistors.

* * * * *

UNITED STATES PATENT AND TRADEMARK OFFICE
CERTIFICATE OF CORRECTION

PATENT NO.  : 4,480,231
DATED       : October 30, 1984
INVENTOR(S) : Shigeru Takehara It is certified that error appears in the above-identified patent and that said Letters Patent is hereby corrected as shown below:

In column 6, line 31, change the first occurrence of "a" to -- at --.

Signed and Sealed this

Nineteenth Day of March 1985

[SEAL]

Attest:

DONALD J. QUIGG

Attesting Officer

Acting Commissioner of Patents and Trademarks